US006285245B1

(12) United States Patent
Watanabe

(10) Patent No.: US 6,285,245 B1
(45) Date of Patent: Sep. 4, 2001

(54) CONSTANT VOLTAGE GENERATING CIRCUIT

(75) Inventor: Hiroshi Watanabe, Hiji-Machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/416,372

(22) Filed: Oct. 12, 1999

(30) Foreign Application Priority Data

Oct. 12, 1998 (JP) ........................................ 10-289832

(51) Int. Cl.[7] ........................ G05F 3/20; H03K 17/14

(52) U.S. Cl. ........................ 327/540; 327/542; 327/513; 323/314

(58) Field of Search ........................ 327/539, 540, 327/541, 542, 513; 323/313, 314, 315, 907, 316

(56) References Cited

U.S. PATENT DOCUMENTS

| | | | | |
|---|---|---|---|---|
| 4,591,804 | * | 5/1986 | Van Tuijl | 323/316 |
| 4,795,918 | * | 1/1989 | Menon et al. | 327/540 |
| 5,038,053 | * | 8/1991 | Djenguerian et al. | 327/540 |
| 5,146,152 | * | 9/1992 | Jin et al. | 323/280 |
| 5,304,918 | * | 4/1994 | Khieu | 323/315 |
| 5,587,655 | * | 12/1996 | Oyabe et al. | 323/312 |
| 5,838,578 | * | 11/1998 | Pippin | 327/512 |
| 5,926,062 | * | 7/1999 | Kuroda | 327/538 |

* cited by examiner

*Primary Examiner*—My-Trang Nuton
*Assistant Examiner*—Terry L. Englund
(74) *Attorney, Agent, or Firm*—William B. Kempler; Frederick J. Telecky, Jr.

(57) ABSTRACT

A constant voltage generating circuit, with a negative temperature coefficient, is able to generate a stable voltage despite variations in the power supply voltage. The constant voltage generating circuit comprises a reference current source circuit 10B, a diode DX, an amplifier circuit AMP that amplifies the voltage across diode DX and outputs voltage $V_{CS}$, and current control circuit 20 that controls the current flowing into node N1. Current control circuit 20 comprises transistors QB1 and QB2, which form a current-mirror constant-current source, and a diode QB3 which has the same characteristics as said diode DX. The current control circuit sinks current from node N1 to transistor QB1 and maintains the temperature coefficient of voltage $V_{CS}$ at a negative value. Reference current source circuit 10B is not affected by the change in the power supply voltage $V_{CC}$ and is able to supply a constant current to node N1.

5 Claims, 4 Drawing Sheets

CONSTANT VOLTAGE GENERATING CIRCUIT

FIELD OF THE INVENTION

The present invention pertains to a constant voltage generating circuit (reference voltage power supply circuit). In particular, the present invention pertains to a constant voltage generating circuit (reference voltage power supply circuit) for an electronic circuit which has a low temperature dependence and can be operated at a low power supply voltage.

BACKGROUND OF THE INVENTION

FIG. 1 is a circuit diagram illustrating an ECL (Emitter Coupled Logic) inverter/buffer circuit as an example of the electronic circuit to which the constant voltage generating circuit of the present invention can be applied.

The ECL inverter/buffer circuit has second and third npn bipolar transistors Q2 and Q3 whose emitters are connected together and which can function as a differential amplifier. The ECL inverter/buffer circuit also has load resistors RL, RL of the same resistance value arranged between the collectors of transistors Q2, Q3 and the supply part (supply rail) of the first power supply voltage $V_{cc}$. In addition, the ECL inverter/buffer circuit has a first npn bipolar transistor Q1 used as a constant current source and a first resistor RE1 which are connected between the supply rail of the second power supply voltage $V_{EE}$ and the connection node of the emitters of transistors Q2 and Q3.

The ECL inverter/buffer circuit has a fourth npn bipolar transistor Q4, which acts as an output buffer, and whose collector is connected to the supply rail of the first power supply voltage $V_{CC}$. The first output signal at the collector of the second transistor Q2 is applied to the base of the fourth bipolar transistor. A sixth npn bipolar transistor Q6, which acts as a constant current source for transistor Q4, and a second resistor RE2 are connected between the emitter of transistor Q4 used as the output buffer and the supply rail of the second power supply voltage $V_{EE}$.

The ECL inverter/buffer circuit also has a fifth npn bipolar transistor Q5, which acts as an output buffer, and is connected to the supply rail of the first power supply voltage $V_{CC}$. The second output signal at the collector of the third transistor Q3 is applied to the base of the fifth bipolar transistor. A seventh npn bipolar transistor Q7, which acts as the constant current source of transistor Q5, and a third resistor RE3 are connected between the emitter of transistor Q5 used as the output buffer and the supply rail of the second power supply voltage $V_{EE}$.

In the ECL inverter/buffer circuit shown in FIG. 1, a signal corresponding to the difference between the first input signal AY applied to the base of the second transistor Q2 and the second input signal AX applied to the base of the third transistor Q3 is output to the collectors of the second and third transistors Q2 and Q3. The output signals are applied to the bases of the fourth and fifth transistors Q4 and Q5 which are used as the output buffers. The final output signals X and Y are output from the emitters of said transistors Q4 and Q5, respectively.

In the ECL inverter/buffer circuits shown in FIG. 1, a control voltage (or reference voltage) $V_{CS}$ is applied to the bases of transistors Q1, Q6, and Q7 used as the constant current sources such that control currents $I_{CS}$ of equal value flow from said transistors Q1, Q6, and Q7 through resistors RE1–RE3, respectively.

In the ECL inverter/buffer circuits shown in FIG. 1, the first to the third resistors RE1–RE3 have the same resistance of $R_e$.

The amount of current $I_{CS}$ flowing through transistors Q1, Q6, and Q7 is relatively large.

In the ECL inverter/buffer circuit shown in FIG. 1, there are three constant current sources. Consequently, the power consumption is $V_{CC} \times I_{CS} \times 3$ ($V_{CC}$ is the value of the power supply voltage $V_{CC}$, and $I_{CS}$ is the value of the control current $I_{CS}$).

The control current $I_{CS}$ flowing through transistors Q1, Q6, and Q7 is defined by the following formula 1.

$$I_{CS}=(V_{CS}-V_{BE})/R_e \tag{1}$$

where $V_{CS}$ is the reference voltage (control voltage) applied to the bases of transistors Q1, Q6, and Q7;

$V_{BE}$ is the base-emitter voltage (pn junction voltage) of transistors Q1, Q6, and Q7; and $R_e$ is the resistance of the first to third resistors RE1–RE3.

When the total power consumption of a logic integrated circuit (logic IC) formed by integrating many logic circuits including the ECL inverter/buffer circuit shown in the FIG. is calculated on the bases of the aforementioned current consumption, it is found that the power consumption of the entire IC chip is in the range of one to several watts. The surface temperature of the IC chip becomes high due to the heating caused by the current consumed.

In addition to finding an effective heat dissipation method to prevent the aforementioned heating problem, it is also necessary to find a means which can effectively prevent "thermal runaway," which will destroy the IC chip as a result of repeating the cycle in which the chip is heated by the current consumed, and which in turn further increases the current consumption.

In order to prevent thermal runaway, the temperature coefficient of control current $I_{CS}$ is preferrably to be negative. In formula 1, the temperature coefficient of the pn junction voltage $V_{BE}$ of the bipolar transistor is negative. It is usually −2 mV/° C. Consequently, the temperature coefficient of control voltage $V_{CS}$ must be greater than −2 mV/° C. It is also necessary to control the temperature coefficient of control voltage $V_{CS}$ in consideration of the temperature coefficients of resistors RE1–RE3. If the temperature coefficients of the resistors are negative, by adding these temperature coefficients, the temperature coefficient of control voltage $V_{CS}$ must have an even larger negative value. Also, it is preferred that [the temperature coefficient of the control voltage] be constant irrespective of the changes in the first and second power supply voltages $V_{CC}$ and $V_{EE}$.

Based on the aforementioned point of view, a conventional constant voltage generating circuit (reference voltage generating circuit) used for generating the control voltage (reference voltage) applied to the bases of transistors Q1, Q6, and Q7 in the ECL inverter/buffer circuit shown in FIG. 1 or a voltage applied to another electronic circuit will be explained with reference to FIGS. 2 and 3.

The constant voltage generating circuit (reference voltage generating circuit) shown in FIG. 2 is a well-known constant voltage generating circuit called a bandgap reference circuit.

The bandgap reference-type constant voltage generating circuit has a reference current source circuit $I_{ref}$, an npn bipolar transistor Q11, an npn bipolar transistor Q12 whose base is connected to its collector and can function as a pn junction diode, as well as resistors RC1, RC2, and RE. The constant voltage generating circuit also has a buffer circuit BUF, which is an amplifier circuit with a gain of 1 and has an npn bipolar transistor Q13 (not shown in the FIG.) incorporated.

As can be seen from the FIG., a current-mirror constant-current source is formed by transistors Q11 and Q12.

In the constant voltage generating circuit shown in FIG. 2, a voltage $V_{CS}$ of prescribed value can be output from buffer circuit BUF by setting the values of resistors RC1, RC2, and RE appropriately.

In the constant voltage generating circuit shown in FIG. 2, it is believed that transistors Q1 and Q12 used for forming the current mirror type current source circuit have the same characteristics. Consequently, the voltage $V_{RE}$ across resistor RE can be expressed by the following formula.

$$V_{RE}=V_{BE}(Q12)-V_{BE}(Q11)=(kT/q)\times 1n(I_{c2}/I_{c1}) \qquad (2)$$

where, $V_{BE}$(Q11) is the base-emitter voltage of transistor Q11, $V_{BE}$(Q12) is the base-emitter voltage of transistor Q12, $I_{c1}$ is the current flowing through resistor RC1, $I_{c2}$ is the current flowing through resistor RC2, T is the absolute temperature, k is Boltzmann's constant, and q is the charge on the electron.

The voltage $V_{CS}$ output from buffer circuit BUF is expressed by the following formula.

$$\begin{aligned} V_{CS} &= V_{BE}(Q13)+V_{RC1} \qquad (3)\\ &= V_{BE}(Q13)+(R_{c1}/R_e)\times V_{RE}\\ &= V_{BE}(Q13)+(R_{c1}/R_e)\cdot Vth\cdot \ln(I_{C2}/I_{C1})\\ &= V_{BE}(Q13)+(R_{c1}/R_e)\cdot(kT/q)\cdot \ln(I_{C2}/I_{C1}) \end{aligned}$$

where, $V_{BE}$(Q13) is the base-emitter voltage of transistor Q13 incorporated in buffer circuit BUF, $V_{RC1}$ is the voltage across resistor RC1, $R_{c1}$ is the resistance of resistor RC1, and $R_e$ is the resistance of resistor RE.

The base-emitter voltage (pn junction voltage) $V_{BE}$(Q13) of transistor Q13 incorporated in buffer circuit BUF has a temperature coefficient of about −2 mV/° C. The temperature coefficient of control voltage $V_{CS}$ becomes 0when (RC1/RE)·(kT/q)·1n($I_{c2}/I_{c1}$)=23.2, where Boltzmann's constant k=1.38×$10^{-23}$ (J/K) and electronic charge q=1.6×$10^{-19}$ (C) have been substituted into the formula. If $V_{BE}$(Q13) is assumed to be 0.8 V and the values of the resistors are selected appropriately at 25° C., the output voltage $V_{CS}$ becomes 1.25 V, which is close to the bandgap value of silicon (1.2 V).

The bandgap reference type constant voltage generating circuit shown in FIG. 2 is not affected by the change in the first power supply voltage $V_{CC}$ (has no voltage dependence) and is able to control the temperature coefficient as described above. This is an advantage.

The constant voltage generating circuit shown in FIG. 3 has a reference current source circuit $I_{ref}$, a diode DX using the pn junction of a transistor formed by connecting the base to the collector of bipolar transistor QX, and an amplifier circuit AMP.

The amplifier circuit AMP has an input resistorR1, a negative feedback resistor R2, and an amplifier QAMP made up of a bipolar transistor.

In this constant voltage generating circuit, the pn junction voltage $V_{BE}$ of transistor QX is yamplified by (R1+R2)/R1 using amplifier circuit AMP, and the amplified voltage is output as output voltage $V_{CS}$.

When the voltage drop of the pn junction of transistor QX in the forward direction, that is, the base-emitter voltage $V_{BE}$ of the transistor as well as the values of resistors R1 and R2 are set appropriately, like that of the bandgap reference circuit, the output voltage $V_{CS}$ can also be set in the range of about 1.25–1.30 V.

In the ECL inverter/buffer circuit shown in FIG. 1, the temperature coefficient of the base-emitter voltage $V_{BE}$ of the bipolar transistor, that is, the voltage drop $V_{BE}$ of the pn junction of the transistor in the forward direction is about −2 mV/° C. When the ECL inverter/buffer circuit is fabricated as an IC circuit, resistors RE1–RE3 are formed as diffusion resistors or polysilicon resistors. Polysilicon resistors have a negative temperature coefficient.

When resistors RE1–RE3 are made of polysilicon and the constant voltage generating circuit used for generating control voltage $V_{CS}$ exhibits a positive temperature coefficient, the temperature coefficient of control current $I_{CS}$ becomes positive. As a result, the IC chip might be destroyed as a result of thermal runaway.

In the constant voltage generating circuit shown in FIG. 2, output voltage $V_{CS}$ is defined by formula 3, that is, $V_{CS}=V_{BE}$(Q13)+α(kT/q). Since kT/q indicates a positive temperature coefficient, the temperature coefficient of output voltage $V_{CS}$ cannot be a negative temperature coefficient greater than that of voltage $V_{BE}$, that is, the pn junction voltage. Consequently, the aforementioned purpose of obtaining a negative temperature coefficient greater than that of $V_{BE}$ cannot be realized by the constant voltage generating circuit shown in FIG. 2.

In the constant voltage generating circuit shown in FIG. 3, even when it is assumed that reference current source circuit $I_{ref}$ is independent of the temperature characteristics, since the temperature coefficient of output voltage $V_{CS}$ is defined as the value obtained by amplifying the temperature coefficient of the pn junction voltage $V_{BE}$ of the transistor by the gain of amplifier circuit AMP, that is, (R1+R2)/R1, the temperature coefficient of output voltage $V_{CS}$ is determined solely by the value of output voltage $V_{CS}$. This is a disadvantage.

For example, when output voltage $V_{CS}$ is 1.3 V, the temperature coefficient of output voltage $V_{CS}$ cannot be defined as, say, −2.4 mV/° C. independent of the voltage value. When output voltage $V_{CS}$ is 1.3 V, the temperature coefficient is determined by the voltage value at that time. This is a disadvantage.

Some conventional control (output) output voltage $V_{CS}$ generating circuits used for the ECL inverter/buffer circuit shown in FIG. 1 are explained with reference to FIGS. 2 and 3. These constant voltage generating circuits can be used for other types of electronic circuits in addition to the circuit shown in FIG. 1. However, the same problem concerned with the aforementioned thermal runaway also occurs when they are used for other types of electronic circuits.

One purpose of the present invention is to provide a constant voltage generating circuit which can control the temperature dependence to prevent thermal runaway and is able to generate a constant voltage in spite of the change in the power supply voltage.

Another purpose of the present invention is to provide a constant voltage generating circuit which can generate a voltage with a prescribed value.

Yet another purpose of the present invention is to provide a constant voltage generating circuit which has the aforementioned properties and can be incorporated with electronic circuits, preferably, semiconductor integrated circuits.

SUMMARY OF THE INVENTION

The present invention provides a constant voltage generating circuit comprising a voltage generating circuit made up of a first bipolar transistor connected as a first diode and an amplifier circuit that amplifies the voltage across the first diode to output a prescribed voltage, a reference current source circuit that sources current to the first diode, and a current control circuit that shunts the current flowing to the first diode.

In the aforementioned constant voltage generating circuit, since the current control circuit sources current to the first diode, the temperature coefficient of the constant voltage generating circuit is kept negative. Consequently, thermal runaway will not occur even if the temperature rises.

The aforementioned current control circuit comprises a first resistor, a second bipolar transistor, and a third bipolar transistor connected in series between the first and second power supply rails, as well as a fourth bipolar transistor which is connected in parallel with the first diode. The base of the second bipolar transistor is connected to its collector to form a second diode. The base of the third bipolar transistor and the base of the fourth bipolar transistor are connected to the collector of the third bipolar transistor to form a first current mirror.

The aforementioned reference current source circuit comprises a first MOS transistor connected between the first power supply rail and the anode of the first diode, and a second MOS transistor with its gate and drain connected to the gate of the first MOS transistor, and a second current mirror circuit constituted with the first and second MOS transistors.

The aforementioned reference current circuit has a second resistor and a fifth bipolar transistor connected in series between the first and second power supply rails, a sixth bipolar transistor connected between the drain of the second MOS transistor and the second power supply terminal, a third resistor, a seventh bipolar transistor, and an eighth bipolar transistor connected in series between the first and second power supply rails, a ninth bipolar transistor connected in parallel with the fifth bipolar transistor, as well as a tenth bipolar transistor and a fourth resistor which are connected in series between the first and second power supply rails. The bases of the fifth and sixth bipolar transistors are connected to the collector of the fifth bipolar transistor to form the third current mirror circuit. The bases of the seventh and tenth bipolar transistors are connected to the collector of the seventh bipolar transistor to form the fourth current mirror circuit. The bases of the eighth and ninth bipolar transistors are connected to the connection node between the tenth bipolar transistor and the fourth resistor.

Specifically, in the first type of the reference current source circuit, the aforementioned current-mirror constant-current source has two MIS transistors. The gates of the two transistors are connected together. One of the transistors has its drain or source connected to its gate. The output terminal of the other transistor is connected to the first diode.

Preferably, the aforementioned current-mirror constant-current source also has a first bipolar transistor with the input terminal connected to the output terminal of one of the aforementioned MIS transistors, a second bipolar transistor with its gate connected to the output terminal of the first transistor and with the input terminal connected to the gate of the first transistor, and a resistor connected between the input terminal of the second transistor and the first voltage supply rail.

The second type of the aforementioned reference current source circuit has a first current-mirror constant-current source, the second current-mirror constant-current source, the third current-mirror constant-current source, and a resistor which is arranged between the output terminal of the third current-mirror constant-current source and the first power supply voltage supply rail to regulate the output current of the reference current source circuit.

One of the output terminals of the first current-mirror constant-current source is connected to the first diode.

One of the output terminals of the second current-mirror constant-current source is connected to the other output terminal of the first current-mirror constant-current source.

One of the output terminals of the third current-mirror constant-current source is connected to the other output terminal of the second current-mirror constant-current source.

The aforementioned resistor is arranged between the other output terminal of the third current-mirror constant-current source and the first voltage supply rail to regulate the current flowing to the third current-mirror constant-current source.

Compared with the constant voltage generating circuit using the first type of the reference current source, the constant voltage generating circuit using the second type of reference current source can be operated even at a low power supply voltage.

The third type of reference current source circuit has an additional transistor, which has its output terminal connected to the connection node between of the gates of the two transistors used for constituting the third current-mirror constant-current source, in the second type of the reference current source circuit.

Compared with the constant voltage generating circuit using the second type of reference current source, the constant voltage generating circuit having the third type of reference current source circuit is able to generate a constant output voltage even when the power supply voltage changes significantly.

In the second and third types of reference current source circuits, the first current-mirror constant-current source has two MIS transistors. The gates of the two transistors are connected together. One of the MIS transistors connected to one of the output terminals of the second current-mirror constant-current source has its drain or source connected to its gate. The output terminal of the other MIS transistor is connected to the first diode.

The second current-mirror constant-current source has two bipolar transistors. One of the bipolar transistors connected to one of the output terminals of the third current-mirror constant-current source has its collector and base connected together. The output terminal of the other bipolar transistor is connected to the other MIS transistor of the first current-mirror constant-current source.

The third current-mirror constant-current source has two bipolar transistors. One of the bipolar transistors connected to the aforementioned resistor has its collector connected to its base. The output terminal of the other bipolar transistor is connected to the other bipolar transistor of the second current-mirror constant-current source.

REFERENCE NUMERALS AND SYMBOLS AS SHOWN IN THE DRAWINGS

10, 10A, 10B Current source circuit

20 Current control circuit

30 Voltage generating circuit

DESCRIPTION OF THE EMBODIMENTS

In the following, an embodiment of the constant voltage generating circuit of the present invention will be explained with respect to the figures.

Figure 1:
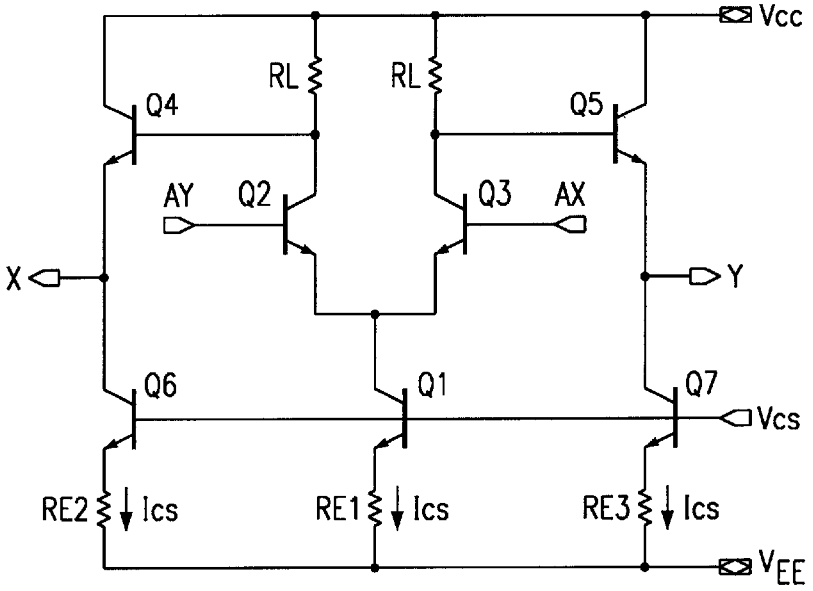
FIG. 1 (PRIOR ART)
FIG. 1 is a diagram illustrating an ECL inverter/buffer circuit as an example of the electronic circuit operated by the constant voltage generating circuit of the present invention.

The ECL inverter/buffer circuit shown in FIG. 1 is an example of the electronic circuit to which the constant voltage generating circuit of the present invention can be applied. In the following, a circuit used for generating the control voltage $V_{CS}$ of transistors Q1, Q6, and Q7 of the constant current source in the ECL inverter/buffer circuit will be explained.

The case of using diffusion resistors with a positive temperature coefficient as resistors RE1–RE3 in the aforementioned ECL inverter/buffer circuit has been explained. In the following, the case of using polysilicon resistors with a negative temperature coefficient as resistors RE1–RE3 shown in FIG. 1 will be explained as a preferred embodiment of the present invention.

Unlike a diffusion resistor, a polysilicon resistor has a negative temperature coefficient. Consequently, the polysilicon resistor must have a negative temperature coefficient greater than that of the voltage $V_{CS}$ generated by the constant voltage generating circuit to be explained below.

On the other hand, when diffusion resistors or external resistors are used as resistors RE1–RE3, since resistors RE1–RE3 will have a positive temperature coefficient, in order to keep the temperature coefficient of current $I_{CS}$ flowing through transistors Q1, Q6, and Q7 negative, the voltage $V_{CS}$ generated by the constant voltage generating circuit to be explained below must have a negative temperature coefficient greater than that of the pn junction voltage $V_{BE}$ of transistor QX.

First Embodiment

Figure 4:
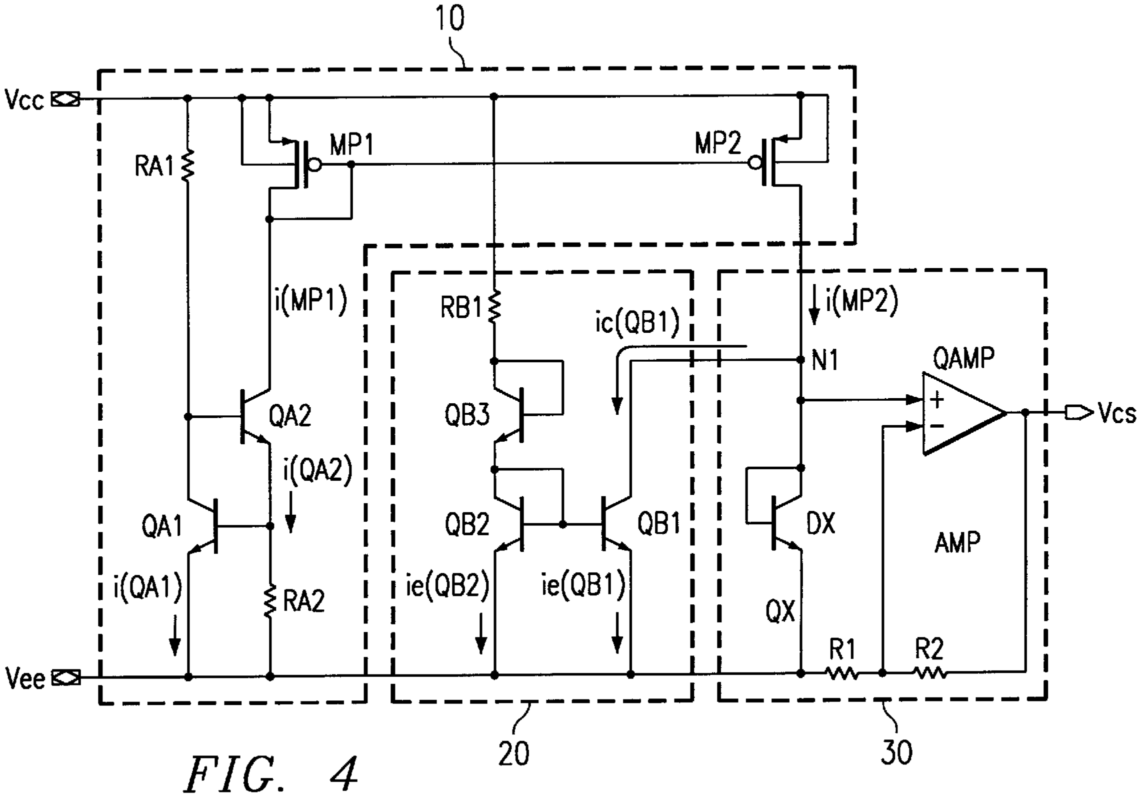
FIG. 4 is a circuit diagram illustrating a first embodiment of the constant voltage generating circuit of the present invention.

FIG. 4 is a diagram illustrating a first embodiment of the constant voltage generating circuit of the present invention used for generating control voltage $V_{CS}$ applied to the bases of transistors Q1, Q6, and Q7 used as the constant current sources in the ECL inverter/buffer circuit shown in FIG. 1.

In the first embodiment, resistors RE1–RE3 shown in FIG. 1 are made of polysilicon which has a negative temperature coefficient.

The constant voltage generating circuit shown in FIG. 4 comprises current source circuit 10, current control circuit 20, and voltage generating circuit 30.

Figure 3:
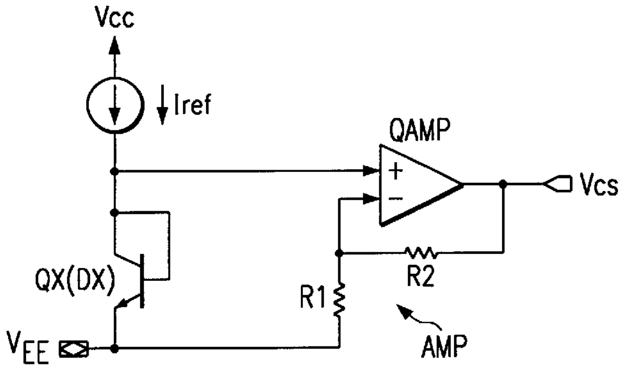
FIG. 3 (PRIOR ART)
FIG. 3 is a diagram illustrating the configuration of another conventional constant voltage generating circuit.

Said voltage generating circuit 30 is essentially identical to the constant voltage generating circuit shown in FIG. 3 and using the pn junction voltage of a transistor. In FIG. 3, however, reference current source circuit $I_{ref}$ is shown as a part of voltage generating circuit 30. In the embodiment of the present invention, the reference current source circuit $I_{ref}$ shown in FIG. 3 becomes an independent circuit, which is current source circuit 10. Consequently, in FIG. 4, voltage generating circuit 30 is supplied a reference current from current source circuit 10.

Voltage generating circuit 30 has a diode DX, which uses the pn junction of bipolar transistor QX, and an amplifier circuit AMP.

Amplifier circuit AMP has an input resistorR1, a negative feedback resistor R2, and an amplifier QAMP made of a bipolar transistor.

Current source circuit 10 used as the reference current source circuit of voltage generating circuit 30 has p-channel MOS transistors MP1 and MP2 used for forming a current-mirror constant-current source.

Also, current source circuit 10 has npn bipolar transistor QA1, npn bipolar transistor QA2, and resistor RA1 connected between the collector of transistor QA1 and the first power supply voltage $V_{CC}$. Said resistor RA1 is used to regulate the output current of current source circuit 10. The value of resistor RA1 is, for example, 5 KΩ.

In addition, current source 10 has a resistor RA2 connected between the emitter of transistor QA2 and the second power supply $V_{EE}$ (GND). The value of resistor RA2 is, for example, 600 Ω.

Preferably, resistors RA1 and RA2 are made of polysilicon, which has a negative temperature coefficient.

In the following, the operation of current source 10 will be explained briefly.

The collector voltage of transistor QA1 is applied to the base of transistor QA2, and the terminal voltage of resistor RA2 is applied to the base of transistor QA1.

The current i(QA2) flowing through transistor QA2 is determined by the resistance RA1 of resistor RA1, so that i(QA2)=$V_{BE}$(QA1)/RA1. In this case, both the base-emitter voltage $V_{BE}$(QA1) of transistor QA1 and resistance RA1 of resistor RA1 decrease as the temperature rises because their temperature coefficients are negative. Consequently, $V_{BE}$/RA1 has a small temperature coefficient. In other words, the current i(QA1) flowing through transistor QA1 has a small temperature coefficient and is not temperature dependent.

Since transistors MP1 and MP2 constitute a current-mirror constant-current source, the current flowing through transistor MP2 is the same as that flowing to transistor MP1. In other words, a current of i(MP2)=$V_{BE}$(QA1)/RA1 from transistor MP2 enters node N1 of voltage generating circuit 30.

As described above, current source 10 can act as a reference current source which supplies constant current i(MP2) to voltage generating circuit 30.

The operating condition with respect to the power supply voltage $V_{CC}$ of current source 10 is defined by the following formula.

$$V_{BE}(QA1)+V_{CE}(QA2)+V_T(MP1)<V_{CC} \quad (3)$$

where $V_{BE}$(QA1) is the base-emitter voltage of transistor QA1; VCE(QA2) is the collector-emitter voltage of transistor QA2; $V_T$(MP1) is the threshold voltage of transistor MP1; and $V_{CC}$ is power supply voltage $V_{CC}$.

The maximum value of the base-emitter voltage $V_{BE}$ (QA1) of transistor QA1 is about 1.1 V, and the collector-emitter voltage VCE(QA2) of transistor QA2 is about 0.2 V.

The threshold voltage $V_T$ of transistor MP1 varies over a relatively wide range. If the maximum value is assumed to be 1.3 V, the power supply voltage $V_{CC}$ becomes 2.5 V. In fact, however, current source circuit 10 is difficult to operate at a power supply voltage $V_{CC}$ of 2.5 V. Consequently, the power supply voltage $V_{CC}$ should be about 3 V for practical applications.

As described above, when current source 10 shown in FIG. 4 is used, the power supply voltage $V_{CC}$ is 3 V or higher.

Current control circuit 20 has a resistor RB1, a pn junction diode made up of transistor QB3 which has its base connected to its collector. Current control circuit 20 also has npn bipolar transistor QB2 which has its base connected to its collector and npn bipolar transistor QB1. A current-mirror constant-current source is formed by transistors QB1 and QB2.

Preferably, resistor RB1 is made of polysilicon, which has a negative temperature coefficient. The value of resistor RB1 is, for example, 2 KΩ.

As described above based on FIG. 3, during the operation of voltage generating circuit 30 and current source 10 used as the reference current source circuit of voltage generating circuit 30, the pn junction voltage $V_{BE}$(QX) of transistor QX is amplified by (R1+R2)/R1 in amplifier circuit AMP. As a result, the negative temperature coefficient (about −2 mV/° C.) of the pn junction voltage $V_{BE}$(QX) is also amplified. The forward voltage drop of the pn junction of bipolar transistor QX is, for example, about 0.8 V.

However, the aforementioned problem, that is, the fact that the temperature coefficient is determined by the value of the output voltage (or control voltage) $V_{CS}$ and cannot be set independently of the value of the output voltage $V_{CS}$, cannot be solved only by using current source 10 and voltage generating circuit 30. Therefore, current control circuit 20 is adopted to solve this problem.

Since a current-mirror constant-current source is formed by transistors QB1 and QB2 in current control circuit 20, the currents flowing to transistors QB1 and QB2 are equal. In other words, the emitter current $i_e$(QB1) of transistor QB1 is equal to the emitter current $i_e$(QB2) of transistor QB2.

The emitter current $i_e$(QB2) flowing to transistor QB2 is determined by the currents flowing to resistor RB1 and pn junction diode QB3. Resistor RB1 is made of polysilicon and it has a negative temperature coefficient. The temperature coefficients of pn junction diode QB3 as well as transistors QB1 and QB2 are all about −2 mV/° C.

When the temperature rises, the resistance $R_{b1}$ of resistor RB1 which has a negative temperature coefficient decreases. The emitter current $i_e$(QB2) of transistor QB2 is increased as a result of the decrease in the resistance $R_{b1}$ of resistor RB1.

The emitter current $i_e$(QB2) of transistor QB2 is defined by the following formula.

$$i_e(QB2)=(V_{CC}-(V_{BE}(QB2)+V_{BE}(QB3))/R_{b1} \tag{4}$$

where, $V_{BE}$(QB2) is the pn junction voltage of transistor QB2; $V_{BE}$(QB3) is the pn junction voltage of transistor QB3; and $R_{b1}$ is the resistance of resistor RB1.

The temperature coefficient of the voltage applied to resistor RB1 is twice as large as the temperature coefficient of pn junction voltage $V_{BE}$. However, when the temperature rises, the emitter current $i_e$(QB2) of transistor QB2 increases as a result of the decrease [in the resistance and voltage] caused by the temperature variations of both pn junction voltage $V_{BE}$ of transistor QX and resistor RB1.

Since a current-mirror constant-current source is formed by transistors QB1 and QB2, the emitter current $i_e$(QB1) of transistor QB1 is equal to the emitter current $i_e$(QB2) of transistor QB2. Therefore, the emitter current $i_e$(QB2) of transistor QB2 is increased by the same amount as that of the emitter current $i_e$(QB1) of transistor QB1, and the increased part of the current is extracted from node N1 through the collector of transistor QB1.

Consequently, the current i(QX) flowing through transistor QX is defined by the following formula.

$$i(QX)=i(MP2)-i_c(QB1) \tag{5}$$

Since the current i(QX) flowing through transistor QX depends on the pn junction voltage $V_{BE}$ which shows a negative temperature coefficient, the current i(QX) will decrease when the temperature rises. In other words, the current i(QX) has a negative temperature coefficient. In addition, when the decrease in the pn junction voltage $V_{BE}$ caused by the current $i_c$(QB1) extracted from node N1 is taken into consideration, the voltage $V_{BE}$(QX) shows a larger negative temperature coefficient than the general pn junction voltage $V_{BE}$ with respect to the rise in the temperature.

Even if the temperature rises, the current flowing to diode DX from node N1 is controlled by the current $i_c$(QB1) which flows to the collector of transistor QB1 in current control circuit 20, and the current i(QX) flowing through transistor QX does not increase with the rise in the temperature. As a result, a constant pn junction voltage $V_{BE}$ is generated at diode DX. The pn junction voltage $V_{BE}$ is amplified by a factor of (R1+R2)/R1 times in amplifier circuit AMP, and an output voltage $V_{CS}$ with the desired temperature coefficient is obtained.

If an output voltage (control voltage) $V_{CS}$ with a controlled temperature dependence from the constant voltage generating circuit shown in FIG. 4 is applied to the bases of transistors Q1, Q6, and Q7 of the ECL inverter/buffer circuit shown in FIG. 1, the constant current source of the differential amplifier circuit can also function as a stable current source with a low temperature dependence. As a result, the ECL inverter/buffer circuit is free of thermal runaway.

In the aforementioned embodiment, as a preferred example, resistors R1 and R2 in voltage generating circuit 30, resistor RB1 in current control circuit 20, as well as resistors RA1 and RA2 in current source circuit 10 are all made of polysilicon with a negative temperature coefficient and are assembled integrally with other semiconductor circuits as IC chips. However, it is also possible to use resistors with a positive temperature coefficient, such as diffusion resistors or attached resistors of IC chips.

The temperature coefficients of resistors RA1 and RA2 in current source 10 are preferably lower than the absolute value of the temperature constant of the pn junction voltage $V_{BE}$. of transistors QA1 and QA2. Similarly, the temperature coefficient of resistor RB1 in the current control circuit 20 is preferably lower than the absolute value of the temperature constant of the pn junction voltage $V_{BE}$ of transistors QB1, QB2, and QB3.

Second Embodiment

Figure 5:
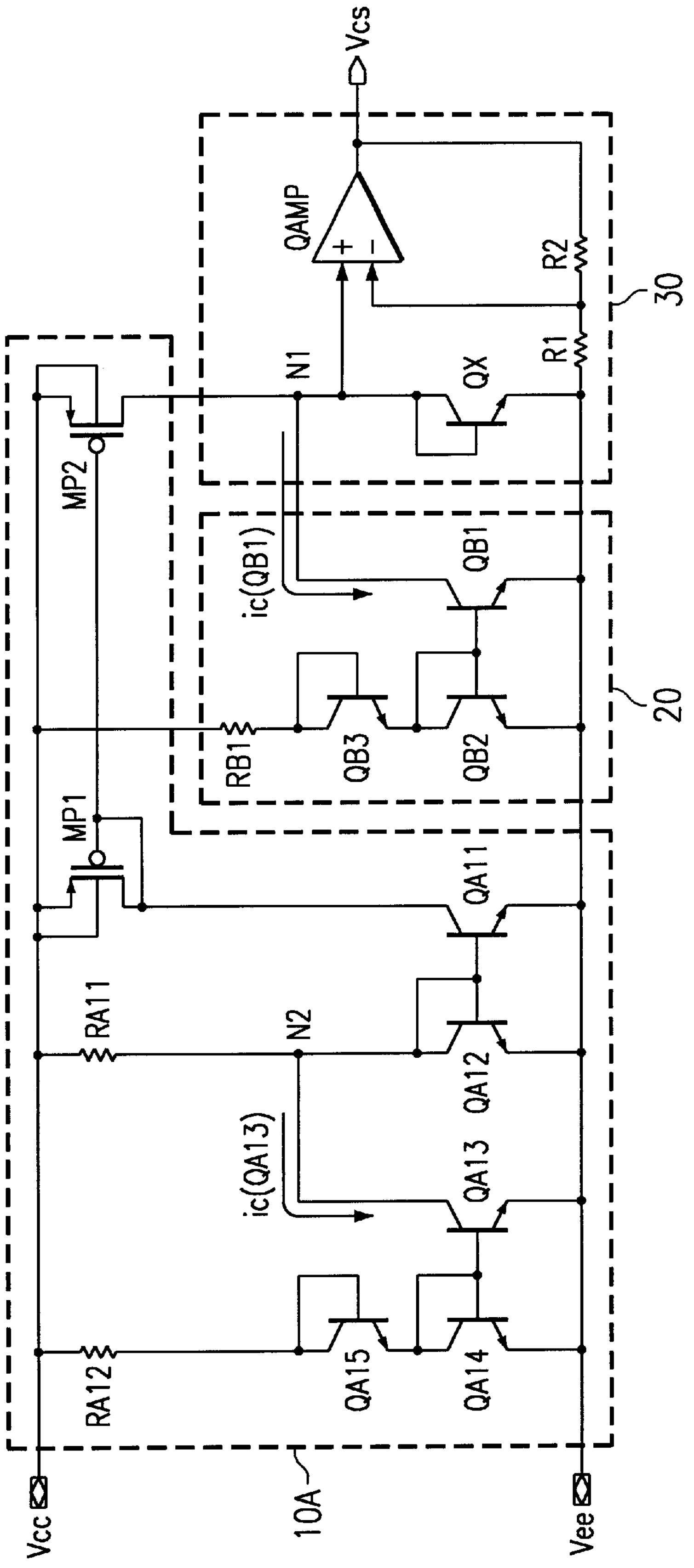
FIG. 5 is a circuit diagram illustrating a second embodiment of the constant voltage generating circuit of the present invention.

FIG. 5 is a diagram illustrating the second embodiment of the constant voltage generating circuit of the present invention used for generating control voltage $V_{CS}$ applied to the bases of transistors Q1, Q6, and Q7 used as the constant current sources in the ECL inverter/buffer circuit shown in FIG. 1.

The voltage generating circuit shown in FIG. 5 has a current source circuit 10A, a current control circuit 20, and a voltage generating circuit 30.

The constant voltage generating circuit shown in FIG. 5 is an improved version of the constant voltage generating circuit shown in FIG. 4. The current source circuit 10 shown in FIG. 4 can operate at a power supply voltage $V_{CC}$ of 3 V or higher. Current source circuit 10A can operate at an even lower $V_{CC}$, about 2.5 V.

Except current source 10A which is different from current source 10 shown in FIG. 4, current control circuit 20 and voltage generating circuit 30 are the same as those shown in FIG. 4. Other details are also identical to those of the first embodiment which have been described above with reference to FIG. 4. Therefore, the explanation of these details is omitted.

The current source 10A used as the reference current source circuit of voltage generating circuit 30 has p-channel MOS transistors MP1 and MP2 which constitute the first current-mirror constant-current source. Current source 10A also has npn bipolar transistor QA11 and npn bipolar transistor QA12 which has its base connected to its collector. The two npn bipolar transistors constitute the second current-mirror constant-current source. In addition, current source 10A has npn bipolar transistor QA13 and npn bipolar transistor QA14 which has its base connected to its collector. The two npn bipolar transistors constitute the third current-mirror constant-current source.

Said current source 10A has a first resistor RA11 and a second resistor RA12. Preferably, resistors RA11 and RA12 are made of polysilicon which has a negative temperature coefficient. The values of resistors RA11 and RA12 are, for example, 600 Ω.

Current source 10A also has a transistor QA15 which is connected between resistor RA12 and the collector of transistor QA14 used for forming the third current-mirror constant-current source. The transistor has its base connected to its collector and functions as a diode.

The collector of transistor QA13 used for forming the third current-mirror constant-current source is connected to the connection point (node N2) between the first resistor RA11 and transistor QA12 used for forming the second current-mirror constant-current source.

In the following, the operation of current source 10A will be explained briefly.

The current flowing into transistor QA14 used for forming the third current-mirror constant-current source is determined by resistor RA12 and the forward resistance of transistor QA15. If the forward resistance of transistor QA15 is much smaller than the resistance of resistor RA12, it can be ignored so that the current flowing into transistor QA14 is determined only by resistor RA12, and $i(QA14)=(V_{CC}-V_{BE}(QA15)-V_{BE}(QA14))/RA_{12}=(V_{CC}-2V_{BE})/RA_{12}$. Both the base-emitter voltage $V_{BE}$(QA14) of transistor QA14 and the resistance $RA_{12}$ of resistor RA12 have negative temperature coefficients, and their values decrease when the temperature rises. Consequently, $V_{BE}/RA_{12}$ has a small temperature coefficient. In other words, the temperature coefficient of the current flowing into transistor QA14 is small.

The magnitude of the current that flows into transistor QA14 is equal to that flowing into transistor QA13. Thus, transistor QA13 extracts that amount of current from node N2. The current flowing through resistor RA11 can be expressed as $i(RA11)=(V_{CC}-2V_{BE})/RA_{11}$.

The current flowing into transistor QA11 used for forming the second current-mirror constant-current source is obtained by subtracting the current flowing into transistor QA13 from the current flowing through resistor RA11. Thus, the current flowing into transistor QA11 can be defined by the following formula when resistors RA11 and RA12 are set to have the same resistance.

$$\begin{aligned} I(QA11) &= I(RA11) - I(QA13) \\ &= (V_{CC} - V_{BE})/RA_{11} - (V_{CC} - 2V_{BE})/RA_{12} \\ &= V_{BE}/RA_{12}(RA_{11} = RA_{12}) \end{aligned} \tag{6}$$

Both voltage $V_{BE}$ and the resistance RA12 of resistor RA12 have negative temperature coefficients. Consequently, the temperature coefficient of the current flowing into transistor QA11 has a small value.

The current flowing into transistor QA11 is sourced by transistor MP1, and current of the same magnitude as that flows from transistor MP1 flows from transistor MP2 into transistor (diode) QX via node N1. The current flowing into diode QX becomes a constant current with a low temperature coefficient if the operation of current source circuit 20 is ignored.

The basic operation of current source circuit 10A as a reference current source circuit has been explained above. In the following, the operating condition of current source circuit 10A with respect to power supply voltage $V_{CC}$ will be explained. The operating condition of current source circuit 10A is defined by the following formula.

$$V_{BE}(QA11)-V_{CE}(QA13)+V_{CE}(QA11)+V_T(MP1)<V_{CC} \tag{7}$$

The maximum value of the base-emitter voltage $V_{BE}$ (QA11) of transistor QA11 is set to be 1.1 V, and the collector-emitter voltages $V_{CE}$(QA13) and $V_{CE}$(QA11) of transistors QA13 and QA11 are both set to be 0.2 V. The threshold voltage $V_T$ of transistor MP1 has a relatively large range of variation. If the maximum value is assumed to be 1.3 V, the power supply voltage $V_{CC}$ becomes 2.4 V. Therefore, the circuit shown in FIG. 5 can operate at a voltage below that of the circuit shown in FIG. 4.

In the constant voltage generating circuit shown in FIG. 5, even when the temperature rises, the current flowing from node N1 to diode DX is controlled by the current $i_c$(QB1) flowing to the collector of transistor QB1 of current control circuit 20. As a result, a constant pn junction voltage $V_{BE}$ is generated at diode DX. The pn junction voltage $V_{BE}$ is amplified by a factor of $(R_1+R_2)/R_1$ by amplifier circuit AMP, and an output voltage (control voltage) $V_{CS}$ with the desired temperature coefficient is output from the amplifier circuit.

If the control voltage $V_{CS}$ with its controlled negative temperature dependence is applied from the constant voltage generating circuit shown in FIG. 5 to the bases of transistors Q1, Q6, and Q7 of the ECL inverter/buffer circuit shown in FIG. 1, the constant current source of the differential amplifier circuit formed by transistors Q2 and Q3 can act as a stable current source with a low temperature dependence. As a result, the ECL inverter/buffer circuit has no thermal runaway and is able to operate stably with respect to temperature variation.

Also, the constant voltage generating circuit shown in FIG. 5 and the ECL inverter/buffer circuit to which the control voltage $V_{CS}$ is applied from the constant voltage generating circuit can operate at a low voltage of about 2.5 V. In addition, since these circuits can also operate at 3.5 V as described above and at the conventional power supply voltage $V_{CC}$ which is about 5 V, the operational range is broad with respect to the change in the power supply voltage $V_{CC}$.

Third Embodiment

Figure 6:
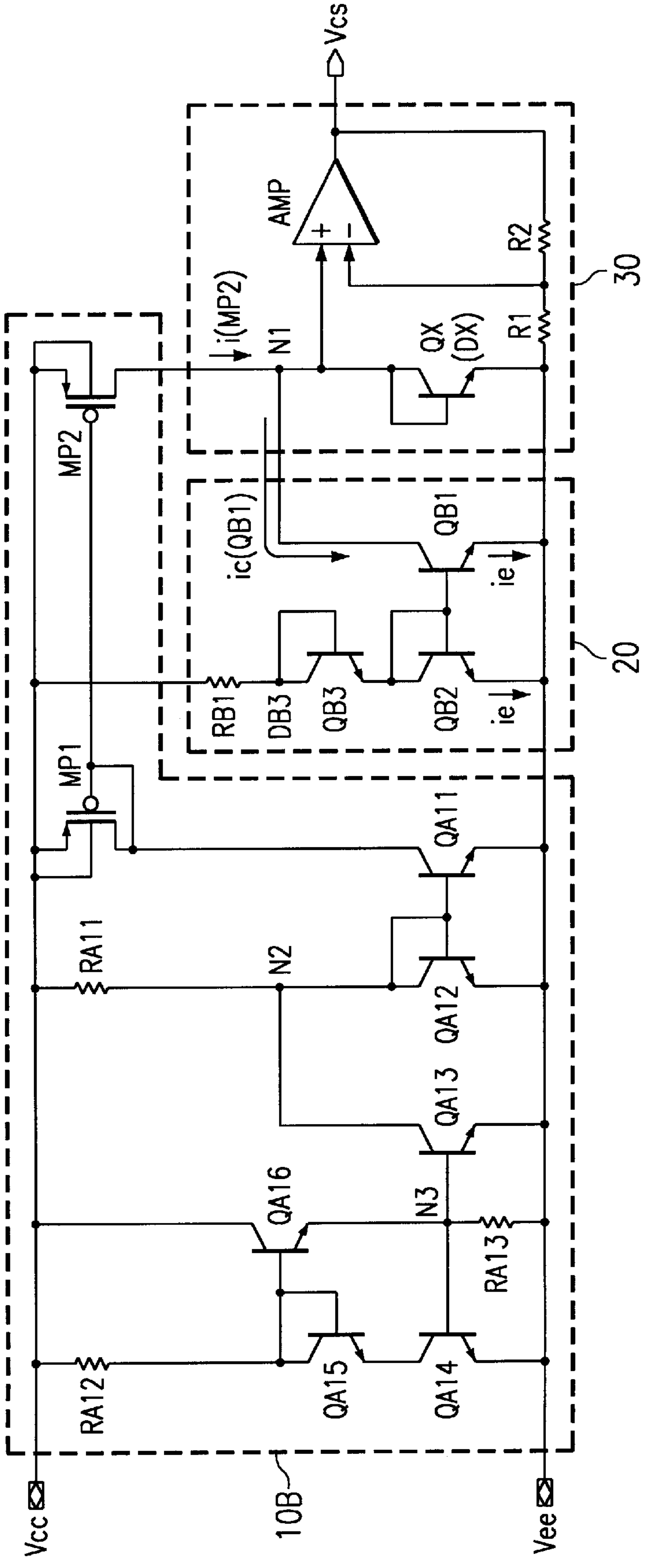
FIG. 6 is a circuit diagram illustrating a third embodiment of the constant voltage generating circuit of the present invention.

FIG. 6 is a diagram illustrating the third embodiment of the constant voltage generating circuit of the present invention used for generating control voltage $V_{CS}$ applied to the bases of transistors Q1, Q6, and Q7 used as the constant current sources in the ECL inverter/buffer circuit shown in FIG. 1.

In this embodiment, resistors RE1–RE3 shown in FIG. 1 are made of polysilicon with a negative temperature coefficient as described above.

The constant voltage generating circuit shown in FIG. 6 has a current source circuit 10B, a current control circuit 20, and a voltage generating circuit 30.

Current control circuit 20 and voltage generating circuit 30 are identical to those which have been explained above with reference to FIGS. 4 and 5.

The constant voltage generating circuit shown in FIG. 6 is an improved version of the constant voltage generating circuit shown in FIG. 5. In this case, the temperature dependence is eliminated by current source circuit 10B, and a stable control voltage $V_{CS}$ can be generated in despite variations in the power supply voltage $V_{CC}$ within the range of 2.5–3.6 V.

The difference between current source 10B shown in FIG. 6 and current source 10A shown in FIG. 5 is that a sixth npn bipolar transistor QA16 and a third resistor RA13 are added to form current source 10B.

In current source 10B, p-channel MOS transistors MP1 and MP2 used for forming the first current-mirror constant-current source, Npn type bipolar transistor QA11 and Npn type bipolar transistor QA12 (with its base and collector connected to each other) used for forming the second current-mirror constant-current source, Npn type bipolar transistor QA15 (with its base connected to its collector) and Npn type bipolar transistor QA16 used for forming the third current-mirror constant-current source, as well as the first and second resistors RA11 and RA12 are identical to those in current source 10A shown in FIG. 5.

Preferably, resistors RA11, RA12, and RA13 are made of polysilicon having a negative temperature coefficient. The values of resistors RA11, RA12, and RA13 are, for example, 600 Ω, 600 Ω, and 5 k Ω, respectively.

In current source 10B, the current i(MP2) flowing into transistor MP2 as a result of the operation of the second current-mirror constant-current source formed by transistors QA11 and QA12 is equal to the current flowing, into transistor QA11. This current is defined as $V_{BE}/RA_2$. In this case, both the base-emitter voltage $V_{BE}$ of transistor QA11 and the resistance RA12 of resistor RA12 decrease when the temperature rises because they have negative temperature coefficients. Consequently, $V_{BE}/RA_{12}$ has a low temperature coefficient. In other words, the temperature coefficient of the current flowing into MOS transistor MP1 has a small value.

The basic operation of the constant voltage generating circuit shown in FIG. 6 is the same as that described in relation to the first and second embodiments.

In the following, the effect of adding transistor QA16 and resistor RA13 to form current source circuit 10B shown in FIG. 6 will be described. First, a source of error for current source circuit 10A shown in FIG. 5 will be evaluated.

In current source circuit 10A shown in FIG. 5, the currents i(RA11), i(QA12), and i(QA13) flowing into resistor RA11, transistor QA12, and transistor QA13 have the following relationship.

$$i(QA12)=i(RA11)-i_c(QA13) \qquad (8)$$

$$i(RA11)=(V_{CC}-V_{BE}(QA12))/RA_{11} \qquad (9)$$

$$i(QA13)=(V_{CC}-(V_{BE}(QA14)+V_{BE}(QA15))/RA_{12} \qquad (10)$$

The following formula is derived from the aforementioned equations.

$$i(QA12)=V_{BE}/RA \qquad (11)$$

where, RA≡RA11=RA12

When the power supply voltage $V_{CC}$ increases, the current flowing through resistor RA12 will increase. As a result, voltages $V_{BE}$(QA14) and $V_{BE}$(QA15) become a little bit higher, and the current flowing to transistor QA12 changes. The change in the current flowing to transistor QA12 results in a change in the current flowing through transistor MP2. Since the value of the current flowing, into node N1 of voltage generating, circuit 30 changes, the constant current source acts as a constant current source with an error.

For example, if the current flowing, through resistor RA12 at a power supply voltage $V_{CC}$ of 2.5 V is designated taken as $i(RA12)_{2.5}$ and the current flowing, through resistor RA12 at a power supply voltage of $V_{CC}$ of 3.6 V is designated as $i(RA12)_{3.6}$, the error can be expressed by the following formula.

$$\Delta i=(V_T\times 1n(i(RA12)_{2.5}/i(RA12)_{3.6})\times 2)/RA \qquad (12)$$

Current source 10B will be explained below.

The additional transistor QA16 in current source 10B is not affected by the change in current i(RA12) flowing through resistor RA12 which occurs as a result of the change in the power supply voltage $V_{CC}$. The current i(RA12) flowing to resistor RA12 can be expressed by the following formula.

$$i(RA12)=(V_{CC}-(V_{BE}(QA14)+V_{BE}(QA16))/RA12 \qquad (13)$$

The current flowing through resistor RA12 is equal to the current flowing through transistor QA14 and also equal to the current flowing through transistor QA13. The difference between formula 13, which defines the current flowing through transistor QA13, and said formula 10 is that the voltage $V_{BE}$(QA15) in formula 12 [sic, 10] is replaced in formula 13 with the voltage $V_{BE}$(QA16) of transistor QA16 which is not affected by the change in the power supply voltage $V_{CC}$ and therefore, the current shown in formula 13 is about half as much as the change in the current shown in formula 10. Consequently, if the error is evaluated in the same way as formula 12, the error caused by the change in the power supply voltage $V_{CC}$ in the circuit shown in FIG. 6 is half as much as the error of the circuit shown in FIG. 5. In other words, when transistor QA16 and resistor RA13 are added to form current source 10B in the constant voltage generating circuit shown in FIG. 6, the change in the current output from transistor MP2 which is caused by the change in the power supply voltage $V_{CC}$ can be reduced by half compared with that in current source 10A shown in FIG. 5.

Table 1 lists the results of simulating the relationship among the change in the power supply voltage $V_{CC}$ in the constant voltage generating circuit shown in FIG. 6, the value of control voltage $V_{CS}$ output from the constant voltage generating circuit, and temperature. The simulation is performed for both cases of $V_{CC}$=2.5 V and $V_{CC}$=3.6.

TABLE 1

| $V_{CC}$ | −40° C. | 0° C. | 40° C. | 80° C. | 120° C. | Temperature coefficient |
|---|---|---|---|---|---|---|
| 2.5V | 1.36V | 1.28V | 1.19V | 1.09V | 0.99V | −2mV/° C. |
| 3.6V | 1.34V | 1.26V | 1.17V | 1.08V | 0.98V | −2mV/° C. |

The control voltage $V_{CS}$ output from the constant voltage generating circuit shown in FIG. 6 barely changes despite of the change in the power supply voltage $V_{CC}$.

Figure 2:
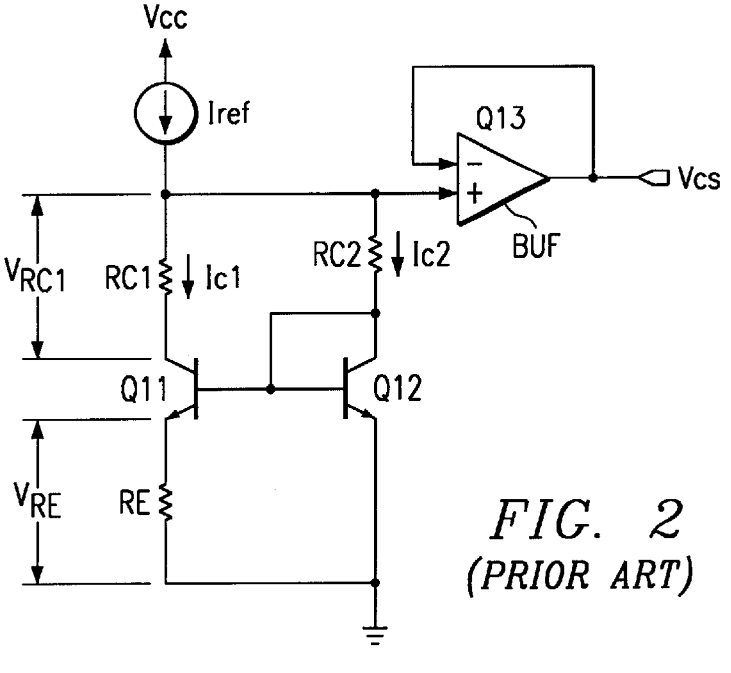
FIG. 2 (PRIOR ART)
FIG. 2 is a diagram illustrating the configuration of a conventional constant voltage generating circuit.

As can be seen from Table 1, when operating at a temperature around 25° C., the constant voltage generating circuit shown in FIG. 6 can generate a low voltage in the same way as the bandgap reference circuit shown in FIG. 2.

The constant voltage generating circuit used for generating control circuit [sic, voltage] $V_{CS}$ applied to the bases of transistors Q1, Q6, and Q7 used as the constant current sources in the ECL inverter/buffer circuit was explained above with reference to FIGS. 4–6. However, the constant voltage generating circuits shown in FIGS. 4–6 can also used to generate reference voltage for other electronic circuits in addition to the ECL inverter/buffer circuit shown in FIG. 1.

The present invention is not limited to the aforementioned embodiments. Various modifications can be made.

First, the values of the aforementioned resistors are only some examples. The values of the resistors can be selected according to the desired specifications.

Second, transistors with conductivity type opposite to that shown in FIGS. 1 and 4–6 can be used.

Also, the circuit examples shown in the figures are basic circuits. In practical application, it is possible to add additional circuit elements, such as a noise elimination circuit, to the basic circuits. Such circuit modifications are self-evident to the expert in the field.

The constant voltage generating circuit of the present invention can operate at a low voltage and is independent of temperature. Also, the influence of the variations in the power supply voltage on the constant voltage generating circuit is negligible, and the constant voltage generating circuit can supply a stable voltage.

The constant voltage generating circuit of the present invention can be integrated with electronic circuits or semiconductor integrated circuits.

What is claimed is:

1. A constant voltage generating circuit comprising a voltage generating circuit made up of a first bipolar transistor connected as a first diode and an amplifier circuit that amplifies the voltage across the first diode to output a prescribed voltage; a reference current source circuit that sources current to the first diode; and a current control circuit that shunts current flowing to the first diode away from the first diode, wherein the current control circuit comprises a first resistor, a second bipolar transistor, and a third bipolar transistor, which are connected in series between first and second power supply rails as well as a fourth bipolar transistor connected in parallel with the first diode; where the base of the second bipolar transistor is connected to its collector to form a second diode, and the base of the third bipolar transistor and the base of the fourth bipolar transistor are connected to the collector of the third bipolar transistor to form a first current mirror circuit.

2. The constant voltage generating circuit described in claim 1 wherein the reference current source circuit comprises a first MOS transistor connected between the first power supply rail and the anode of the first diode, and a second MOS transistor with its gate and drain connected to the gate of the first MOS transistor, and wherein the first and second MOS transistors form a second current mirror circuit.

3. The constant voltage generating circuit described in claim 2, wherein the reference current source circuit further comprises a second resistor and a fifth bipolar transistor connected in series between the first and second power supply rails, a sixth bipolar transistor connected between the drain of the second MOS transistor and the second power rail, a third resistor, a seventh bipolar transistor, and an eighth bipolar transistor connected in series between the first and second power supply rails, a ninth bipolar transistor which is connected in parallel with the fifth bipolar transistor, as well as a tenth bipolar transistor and a fourth resistor which are connected in series between the first and second power supply rails; the bases of the fifth and sixth bipolar transistors are connected to the collector of the fifth bipolar transistor to form a third current mirror circuit; the bases of the seventh and tenth bipolar transistors are connected to the collector of the seventh bipolar transistor to form a fourth current mirror circuit; and the bases of the eighth and ninth bipolar transistors are connected to a connection node between the tenth bipolar transistor and the fourth resistor.

4. A constant voltage generating circuit comprising:

a first bipolar transistor connected as a first diode;

an amplifier circuit coupled to the first bipolar transistor amplifying a voltage across the transistor and providing a prescribed voltage at an output terminal;

a reference current source circuit that sources current to the first transistor; and a control circuit coupled to the first transistor, the control circuit shunting current away from the first transistor to ensure the prescribed voltage at the output terminal has a negative temperature coefficient.

5. The constant voltage generating circuit of claim 4 further comprising an ECL circuit coupled to receive the output voltage wherein the negative temperature coefficient of the output voltage prevents thermal runaway of the ECL circuit.

* * * * *